United States Patent
Ding et al.

(10) Patent No.: US 12,241,936 B2
(45) Date of Patent: Mar. 4, 2025

(54) METHODS AND DEVICES FOR ESTIMATING STATE OF CHARGE OF BATTERY, AND EXTRACTING CHARGING CURVE OF BATTERY

(71) Applicant: SHANGHAI MAKESENS ENERGY STORAGE TECHNOLOGY CO., LTD., Shanghai (CN)

(72) Inventors: Peng Ding, Shanghai (CN); Xiao Yan, Shanghai (CN); Enhai Zhao, Shanghai (CN); Danfei Gu, Shanghai (CN); Pingchao Hao, Shanghai (CN); Pei Song, Shanghai (CN); Weikun Wu, Shanghai (CN); Xiaohua Chen, Shanghai (CN); Guopeng Zhou, Shanghai (CN); Mingchen Jiang, Shanghai (CN)

(73) Assignee: SHANGHAI MAKESENS ENERGY STORAGE TECHNOLOGY CO., LTD., Shanghai (CN)

( * ) Notice: Subject to any disclaimer, the term of this patent is extended or adjusted under 35 U.S.C. 154(b) by 135 days.

(21) Appl. No.: 18/101,218

(22) Filed: Jan. 25, 2023

(65) Prior Publication Data
US 2023/0236252 A1 Jul. 27, 2023

(30) Foreign Application Priority Data
Jan. 26, 2022 (CN) .......................... 202210090929.2

(51) Int. Cl.
*G01R 31/374* (2019.01)
*G01R 31/3828* (2019.01)
*H02J 7/00* (2006.01)

(52) U.S. Cl.
CPC ....... *G01R 31/374* (2019.01); *G01R 31/3828* (2019.01); *H02J 7/00718* (2020.01); *H02J 7/007182* (2020.01)

(58) Field of Classification Search
CPC ............... G01R 31/374; G01R 31/3828; H02J 7/00718; H02J 7/007182
See application file for complete search history.

(56) References Cited

FOREIGN PATENT DOCUMENTS

DE 102009042656 A1 * 3/2011 .......... B60L 11/1857

* cited by examiner

*Primary Examiner* — Minh Q Phan
(74) *Attorney, Agent, or Firm* — troutman pepper locke; Tim Tingkang Xia, Esq.

(57) ABSTRACT

The invention provides methods, devices and non-transitory tangible computer-readable storage media for estimating a state of charge of a battery and extracting a charging curve of the battery. The method for estimating the state of charge of the battery includes estimating a first state of charge of the battery; determining a charging curve that conforms to the present charging scenario, wherein the present charging scenario is characterized by at least one of parameters including an ambient temperature, a charging rate, an internal resistance, a state of health, a lifespan, and an open circuit voltage of the battery; and correcting the first state of charge according to the charging curve to obtain a final state of charge of the battery.

13 Claims, 9 Drawing Sheets

METHODS AND DEVICES FOR ESTIMATING STATE OF CHARGE OF BATTERY, AND EXTRACTING CHARGING CURVE OF BATTERY

CROSS-REFERENCE TO RELATED PATENT APPLICATION

This application claims priority to and the benefit of Chinese Patent Application No. 202210090929.2, filed Jan. 26, 2022, which are incorporated herein in their entireties by reference.

FIELD OF THE INVENTION

The invention relates generally to batteries, and more particularly to methods, devices and non-transitory tangible computer-readable storage media for estimating a state of charge of a battery, and extracting a charging curve of the battery.

BACKGROUND OF THE INVENTION

Batteries have been widely used electric vehicles and energy storages. A battery management system (BMS) is necessary to ensure the safe and efficient operation of the batteries in the way of monitoring battery. The state of charge (SOC) is one of important monitoring parameters in the BMS, since it affects the state of health (SOH), the state of energy (SOE), the state of power (SOP), and even battery safety. Thus, accurate SOC estimation is both essential to batteries. Unfortunately, there is no existing method that can measure SOC directly due to the nonlinear and time-varying characteristics of the batteries, and various other factors such as temperature, usage time, and rate, and so on. The battery SOC can only be estimated by parameters such as the battery terminal voltage, the charging current, the discharging current and the internal resistance. In addition, these parameters are also affected by factors such as battery aging, ambient temperature changes, and vehicle driving conditions, etc.

Therefore, a heretofore unaddressed need exists in the art to address the aforementioned deficiencies and inadequacies.

SUMMARY OF THE INVENTION

One of the objectives of this invention is to provide methods, devices and non-transitory tangible computer-readable storage media for estimating a state of charge of a battery, and extracting a charging curve of the battery, to overcome the deficiencies and inadequacies of the SOC estimation in the prior art.

In one aspect, the invention relates to a method for estimating a state of charge of a battery. The method comprises estimating a first state of charge of the battery; determining a charging curve that conforms to the present charging scenario, wherein the present charging scenario is characterized by at least one of parameters including an ambient temperature, a charging rate, an internal resistance, a state of health, a lifespan, and an open circuit voltage of the battery; and correcting the first state of charge according to the charging curve to obtain a final state of charge of the battery.

In one embodiment, said correcting the first state of charge according to the charging curve comprises determining a present charging voltage of the battery; determining a second state of charge corresponding to the present charging voltage according to the charging curve; determining an amount of a state of charge correction according to the second state of charge; and correcting the first state of charge according to the amount of the state of charge correction to obtain the final state of charge of the battery.

In one embodiment, said determining the amount of the state of charge correction according to the second state of charge comprises determining a correction weight corresponding to the second state of charge, wherein the correction weight is positively correlated with the second state of charge; and determining a product result of a state of charge difference and a correction weight as the amount of the state of charge correction, wherein the state of charge difference is a difference between the second state of charge and the first state of charge.

In one embodiment, the method further comprises, before determining the charging curve that confirms to the present charging scenario judging whether the charging voltage of the battery is greater than a voltage threshold; and when the judgment result is yes, determining the charging curve conforming to the present charging scenario.

In one embodiment, said estimating a first state of charge of the battery comprises estimating the first state of charge of the battery based on a ampere-hour integration method; or estimating the first state of charge of the battery based on a Kalman filter method.

In another aspect, the invention relates to a method for extracting a charging curve of a battery. the method comprises obtaining multiple sets of first charging data of the battery during an entire charging process of the battery in a target charging scenario, wherein each set of the first charging data comprises a charging voltage and a power of the battery, and the target charging scenario is characterized by at least one of parameters including an ambient temperature, a charging rate, an internal resistance, a state of health, a lifespan, and an open circuit voltage of the battery; using an inverse-ampere-hour integration method to calculate a corresponding third state of charge according to each set of the first charging data; for the charging voltage in each set of the first charging data, correcting the charging voltage according to the corresponding third state of charge and the parameters representing the target charging scenario; and determining the charging curve under the target charging scenario according to the corrected charging voltage and the third state of charge.

In one embodiment, the third state of charge is calculated by a formula of:

$$SOC_i = SOC_{end} - \frac{Q_{end} - Q_i}{Ca \cdot SOH};$$

wherein $SOC_i$ represents the third state of charge of the i-th set of the first charging data; $SOC_{end}$ represents the state of charge of the battery at the end of charging; Ca represents a rated capacity of the battery; and SOH represents the state of health of the battery.

In one embodiment, the SOH is obtained by obtaining multiple sets of a second charging data of the battery during the charging and discharging process of the battery according to a preset charging and discharging strategy; and calculating the corresponding SOH according to each set of the second charging data.

In yet another aspect, the invention relates to a device for estimating a state of charge of a battery. The device comprises an estimation module configured to estimate a first state of charge of the battery; a determining module configured to determine a charging curve conforming to a present charging scenario; wherein the present charging scenario is characterized by at least one of parameters including an ambient temperature, a charging rate, an internal resistance, a state of health, a lifespan, and an open circuit voltage of the battery; and a correction module configured to correct the first state of charge according to the charging curve to obtain a final state of charge of the battery.

In a further aspect, the invention relates to a device for extracting a charging curve of a battery. The device comprises an acquisition module configured to obtain multiple sets of first charging data of the battery during an entire charging process of the battery in a target charging scenario, wherein each set of the first charging data comprises a charging voltage and a power of the battery, and the target charging scenario is characterized by at least one of parameters including an ambient temperature, a charging rate, an internal resistance, a state of health, a lifespan, and an open circuit voltage of the battery; a calculation module configured to calculate a corresponding third state of charge according to each set of the first charging data by using an inverse-ampere integration method; a correction module configured to, for each set of charging voltages in the first charging data, correct the charging voltage according to the corresponding third state of charge and the parameters representing the target charging scenario; and a determining module configured to determine the charging curve under the target charging scenario according to the corrected charging voltage and the third state of charge.

In certain aspects, the invention relates to an electronic device comprising at least one memory, at least one processor, and a computer program stored on the at least memory and operable on the processor, wherein, when the processor executes the computer program, the methods disclosed above are implemented.

In certain aspects, the invention relates to a non-transitory tangible computer-readable storage medium, on which a computer program is stored, wherein, when the computer program is executed by a processor, the methods disclosed above are implemented.

In view of the foregoing, the methods, devices and non-transitory tangible computer-readable storage media for estimating a state of charge of a battery, and extracting a charging curve of the battery have the advantageous effects. The estimated state of charge of the battery is corrected by using a charging curve that conforms to the present charging scenario.

Compared with the prior art that uses a fixed charging curve to correct the state of charge, the charging curve used in embodiments of the invention is compatible with the battery life cycle and charging environment, so that the accuracy and effectiveness of the battery state of charge estimation in various charging environments and in the full life cycle can be improved.

DETAILED DESCRIPTION OF THE INVENTION

Figure 1:
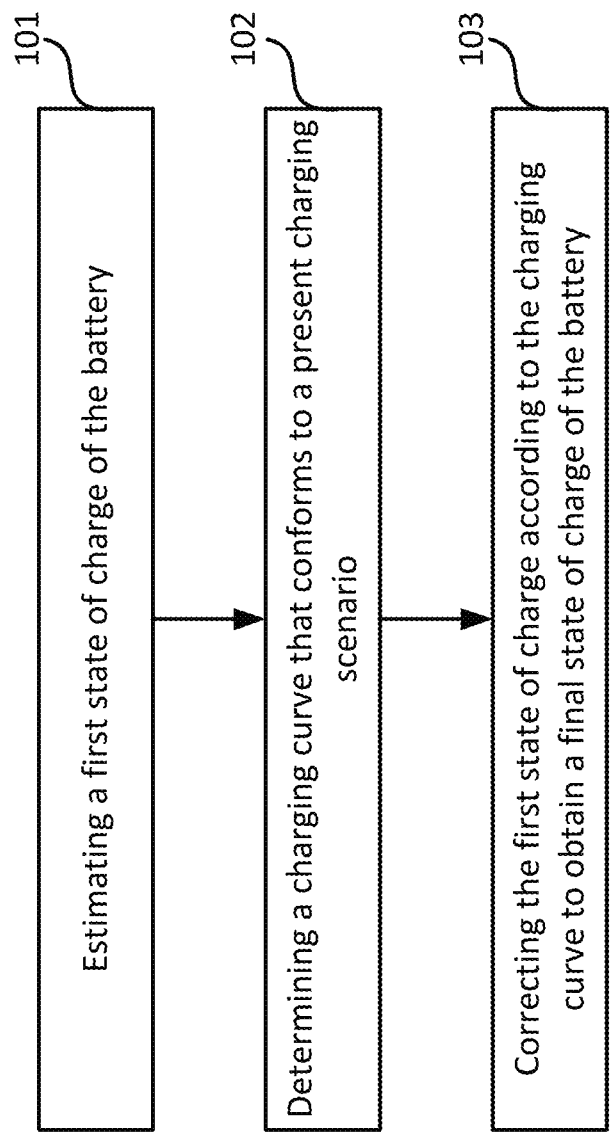
FIG. 1 shows schematically a flowchart of a method for estimating a state of charge of a battery according to one embodiment of the invention.

Embodiments of the invention are described below through specific examples in conjunction with the accompanying drawings in FIGS. 1-6, and those skilled in the art can easily understand other advantages and effects of the invention from the content disclosed in this specification. The invention can also be implemented or applied through other different specific implementations, and various modifications or changes can be made to the details in this specification based on different viewpoints and applications without departing from the spirit of the invention. It should be noted that, in the case of no conflict, the following embodiments and features in the embodiments can be combined with each other.

It should be noted that the drawings provided in the following embodiments are merely illustrative in nature and serve to explain the principles of the invention, and are in no way intended to limit the invention, its application, or uses. Only the components related to the invention are shown in the drawings rather than the number, shape and size of the components in actual implementations. Dimensional drawing, the type, quantity and proportion of each component can be changed arbitrarily in its actual implementations. More complicate component layouts may also become apparent in view of the drawings, the specification, and the following claims.

Referring to FIG. 1, a flowchart of a method for estimating a state of charge (SOC) of a battery is shown according to one exemplary embodiment of the invention. By correcting the estimated SOC of the battery using a charging curve that conforms to the present charging scenario, the accuracy of battery SOC estimation can be improved. As shown in Referring to FIG. 1, the method includes the following steps.

At step 101, estimating the first state of charge (SOC) of the battery.

In one embodiment, the first SOC of the battery is estimated using an ampere-hour integration method. The principle of the ampere-hour integration method is to equate the discharge power of the battery under different currents to the discharge power under a specific current. The estimation accuracy will be affected by the accuracy of the current sensor. In order to improve the estimation accuracy of the battery state of charge, Step 102 needs to be performed so as to correct the first state of charge estimated by using the ampere-hour integration method.

In one embodiment, a Kalman filter method is used to estimate the first state of charge of the battery. The Kalman filter method is the optimal estimation of the state of the dynamical system in the sense of minimum variance, based on the ampere-hour integral method. The key point in the Kalman filter method is a recursive equation including the state of charge estimate and the covariance matrix that reflects the estimation error, and the covariance matrix is used to give a range of the estimation error. The accuracy of the Kalman filter method depends on the establishment of the equivalent model. Due to the aging of the battery itself, it is difficult to establish an equivalent battery model that is accurate throughout its life. In order to improve the estimation accuracy of the battery state of charge, step 102 needs to be performed so as to correct the first state of charge estimated by using the Kalman filter method.

In one embodiment, for a battery in a non-running state or an idle state, in addition to the ampere-hour integration method and the Kalman filter method, an open circuit voltage (OCV) method may also be used to estimate the first state of charge of the battery. Using the corresponding relationship between the open circuit voltage and the SOC of the battery, the SOC is estimated by measuring the open circuit voltage of the battery. Because the measurement of the open circuit voltage of the battery is more complicated. In addition, as the battery ages, the open circuit voltage also changes slightly, which results in errors in the SOC. In order to improve the estimation accuracy of the SOC of the battery, it is necessary to perform step 102 to correct the first state of charge obtained by estimating the open circuit voltage.

At step 102, determining a charging curve that conforms to the present charging scenario.

In one embodiment, the present charging scenario is represented by at least one of the following parameters: environmental parameters that characterize the charging environment, such as the ambient temperature of the battery, etc.; and parameters that characterize the life cycle characteristics of the battery, such as a charging rate, an internal resistance, a state of health (SOH), a lifespan, and an open circuit voltage of the battery, etc.

In one embodiment, the corresponding relationship between the charging curve and various parameters characterizing the charging scenario is obtained through experimental measurements and/or calculations. When determining the charging curve, the parameter values of the parameters representing the present charging scenario is obtained, and the charging curve conforming to the present charging scenario is determined according to the corresponding relationship.

In one embodiment, the corresponding relationship can be represented by, but not limited to, at least one of the forms: tables, functions, and curves.

Figure 2:
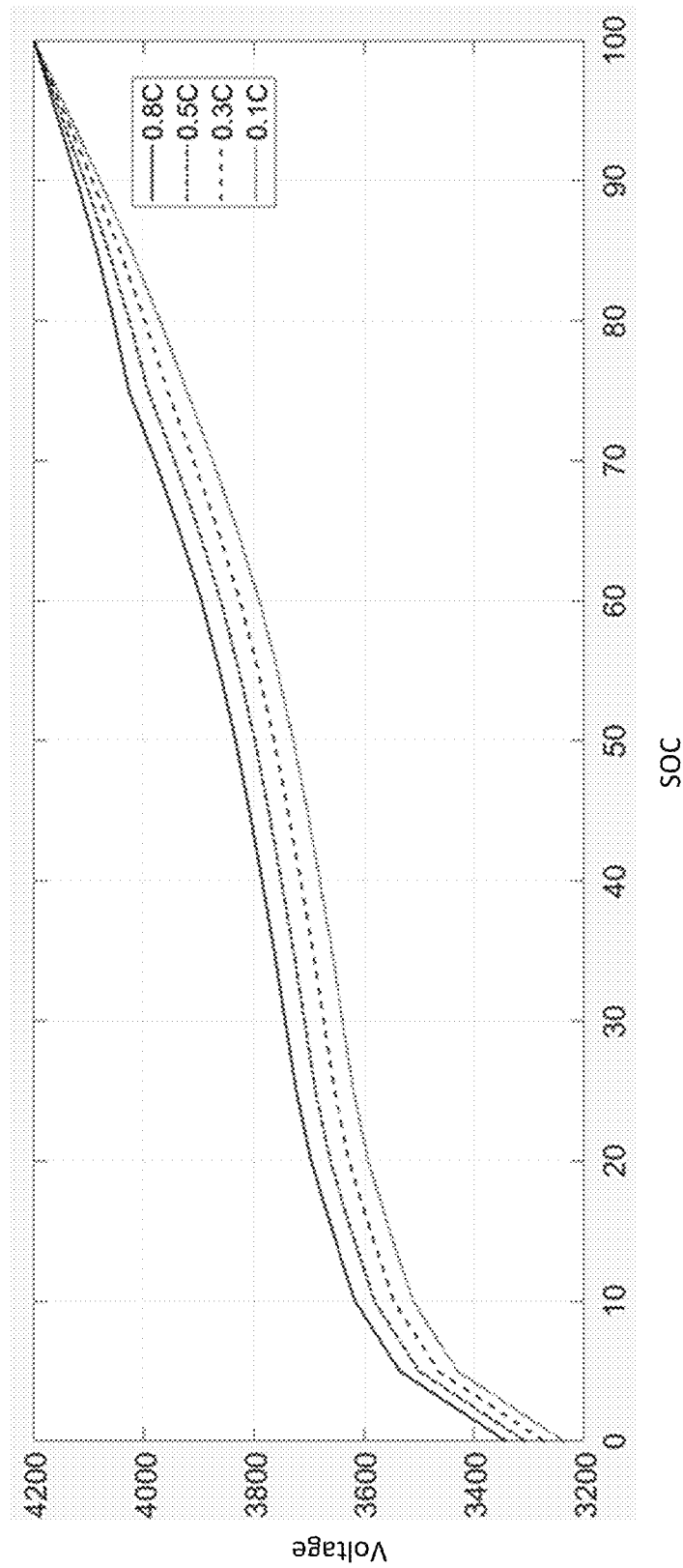
FIG. 2 shows the corresponding relationship between the charging rate and the charging curve measured through experiments according to one embodiment of the invention.

FIG. 2 shows the corresponding relationship between the charging rate and the charging curve measured through experiments according to one exemplary embodiment of the invention, where the charging rate is corresponding to 0.1C, 0.3C, 0.5C, and 0.8C. It should be noted that other charging rates can also be utilized to obtain the charging curves correspondingly.

The corresponding relationship between the internal resistance of the rate and the charging curve can be determined as follows. For the charging curves of different charging rates, linear fitting is performed under different SOCs, where the charging rate is an independent variable, and the charging voltage is a dependent variable. The fitting equation is as follows:

$$V = r \cdot I + \text{Chg0};$$

where r represents the internal resistance under the SOC; I represents the charging rate; Chg0 represents the open circuit voltage at the charge rate of 0 (shorted as "0 rate open circuit voltage" hereinafter). Chg0 in the fitting equation is just an example of the 0 rate open circuit voltage. It should be noted that it can also be open circuit voltages at other charge rates.

The corresponding relationship between different SOCs, internal resistances and charging curves can be obtained by the linear fitting. The details of the corresponding relationship are shown in Table 1 below, where ChgTable represents the open circuit voltage; and Rtable represents the internal resistance.

TABLE 1

Details the corresponding relationship between different SOCs, internal resistance and charging curve

| SOC | Rtable | ChgTable |
|---|---|---|
| 0 | 180 | 3237 |
| 5 | 121 | 3430 |
| 10 | 108 | 3511 |
| 15 | 107 | 3553 |
| 20 | 107 | 3592 |
| 25 | 105 | 3619 |
| 30 | 105 | 3639 |
| 35 | 105 | 3659 |
| 40 | 105 | 3681 |
| 45 | 104 | 3704 |
| 50 | 105 | 3729 |
| 55 | 103 | 3758 |
| 60 | 102 | 3791 |
| 65 | 102 | 3831 |
| 70 | 101 | 3875 |
| 75 | 103 | 3923 |
| 80 | 102 | 3971 |
| 85 | 102 | 4023 |
| 90 | 101 | 4080 |
| 95 | 105 | 4140 |
| 100 | 0 | 4200 |

When fitting the corresponding relationship between the internal resistance of the rate and the charging curve, it is also possible to combine the ambient temperature, use the charging curves of different charging rates under different ambient temperatures, and perform linear fitting under different SOCs, so as to obtain the corresponding relationship between the parameters including the ambient temperature, the charging rate, and the open circuit voltage that characterize the charging scenario and the charging curve.

When determining the charging curve, the values of the parameters representing the present charging scenario are obtained, and according to the corresponding relationship, the charging curve conforming to the present charging scenario is determined.

Taking the parameters of the internal resistance of the rate and the charging rate that represent the present charging scenario as an example, determining the parameter value of the present internal resistance RTable and the parameter value of the present charging rate Ic, and putting them into the following formula to obtain the present charging curve under the present rate (present charging scenario):

$$\text{ChgCurve} = Ic \cdot R\text{Table} + \text{ChgTable};$$

where ChgTable represents the open circuit voltage at the corresponding rate. Based on the above formula, the charging curves at any rates can be obtained.

It should be noted that because RTable and ChgTable are one-to-one corresponding to SOC, ChgCurve is also one-to-one corresponding to SOC, where ChgCurve indicates the charging curve of the battery under the charging rate Ic.

At step 103, correcting the first state of charge according to the charging curve to obtain the final state of charge of the battery.

In one embodiment, the charging curve in step 103 is a charging curve conforming to the present charging scenario. The charging curve represents the corresponding relationship between the charging voltage and the state of charge of the battery.

In one embodiment, the estimated state of charge of the battery is corrected using a charging curve that conforms to the present charging scenario. Compared with the prior art that uses a fixed charging curve to correct the state of charge, the charging curve in the invention is compatible with the battery life cycle and charging environment, so that the accuracy and effectiveness of the state of charge estimation of the battery in various charging environments and in the full life cycle can be improved.

In one embodiment, the state of charge of the battery is determined with the help of the combination method/algorithm. The charging curves of the same battery at different rates and lifespans gradually approaches the cut-off voltage as the state of charge increases. Therefore, in the later stage of charging, the accuracy of the SOC estimated by using the charging curve comparison has a certain guarantee. Based on the above characteristics of the charging curve, the higher the SOC of the battery, the higher the accuracy of the SOC calculated by the combination method.

In one embodiment, said correcting the first state of charge according to the charging curve conforming to the present charging scenario includes steps 103-1, 103-2, 103-3 and 103-4 as follows.

At step 103-1, determining the present charging voltage of the battery.

In one embodiment, the present charging voltage of the battery can be obtained through measurements.

At step 103-2, determining the second state of charge corresponding to the present charging voltage, according to the charging curve.

The charging curve represents the corresponding relationship between the charging voltage and the state of charge. In the situation where the corresponding relationship is represented by a table, the second state of charge corresponding to the present charging voltage can be obtained by looking up the table. In the situation where the corresponding relationship is represented by a function, the present charging voltage is substituted into the function representing the corresponding relationship, then the second state of charge corresponding to the present charging voltage can be obtained.

At step 103-3, determining an amount of the state of charge correction according to the second state of charge.

In one embodiment, the amount of the state of charge correction is the product result of the state of charge difference and the correction weight, where the state of charge difference is the difference between the second state of charge and the first state of charge. The amount of the state of charge correction satisfies the formula of:

$$\Delta S = (S_{chg} - S_{Ah}) \cdot \omega;$$

where $\Delta S$ represents the amount of the state of charge correction; $S_{Ah}$ represents the first state of charge; $S_{chg}$ represents the second state of charge; and $\omega$ represents the correction weight.

In one embodiment, the correction weight is positively correlated with the second state of charge. The greater the difference between the current SOC and the SOC in the charging curve look-up table, the greater the SOC weight of the charging curve.

In one embodiment, the corresponding relationship between the correction weight and the second state of charge can be determined through experimental data. Based on the characteristics of the charging curve of the battery, as the charging progresses, the greater the SOC, the higher the accuracy of the SOC calculated according to the charging curve, and then the correction weight should increase as the SOC increases. The specific setting of the correction weight depends on the battery working conditions and battery characteristics. Table 2 is an example to illustrate that when SOC>50%, the correction weight increases with the SOC.

TABLE 2

| Corresponding relationship between SOC and $\omega$ when SOC > 50% | | | | | | |
|---|---|---|---|---|---|---|
| SOC | 50 | 60 | 70 | 80 | 90 | 100 |
| $\omega$ | 1/600 | 1/500 | 1/400 | 1/300 | 1/200 | 1/100 |

At step 103-4, correcting the first state of charge according to the amount of the state of charge correction to obtain the final state of charge of the battery.

The correction formula for the state of charge is expressed as follows:

$$S_{new} = S_{Ah} + \Delta S = S_{Ah} + (S_{chg} - S_{Ah}) \cdot \omega;$$

where $S_{new}$ represents the final state of charge.

Since the larger the charging voltage is, the larger the error of the state of charge obtained based on step 101 is, when the charging voltage is small, the error of the state of charge obtained based on step 101 is small and may not need to be corrected.

In one embodiment, prior to step 102, it is also judged whether the charging voltage of the battery is greater than the voltage threshold. When the judgment result is no, which means that the charging voltage of the battery is relatively small, there is no need to correct the first state of charge obtained in step 101, then no action is required. When the judgment result is yes, which means that the charging voltage of the battery is relatively large, the first state of charge obtained in step 101 needs to be corrected, then step 102 and step 103 are executed to correct the first state of charge. By judging the charging voltage, unnecessary corrections can be reduced and the amount of calculation can be reduced.

In one embodiment, the voltage threshold can be set according to the actual situation. For example, the voltage threshold is set to the charging voltage of the battery corresponding to the charging curve of the specified rate when SOC=50%.

In one embodiment, it is determined whether the first state of charge needs to be corrected based on the ambient temperature of the battery. In this situation, the voltage threshold can be set to the charging curve of a specified rate at 25° C. at SOC=50% corresponds to the charging voltage of the battery.

Figure 3:
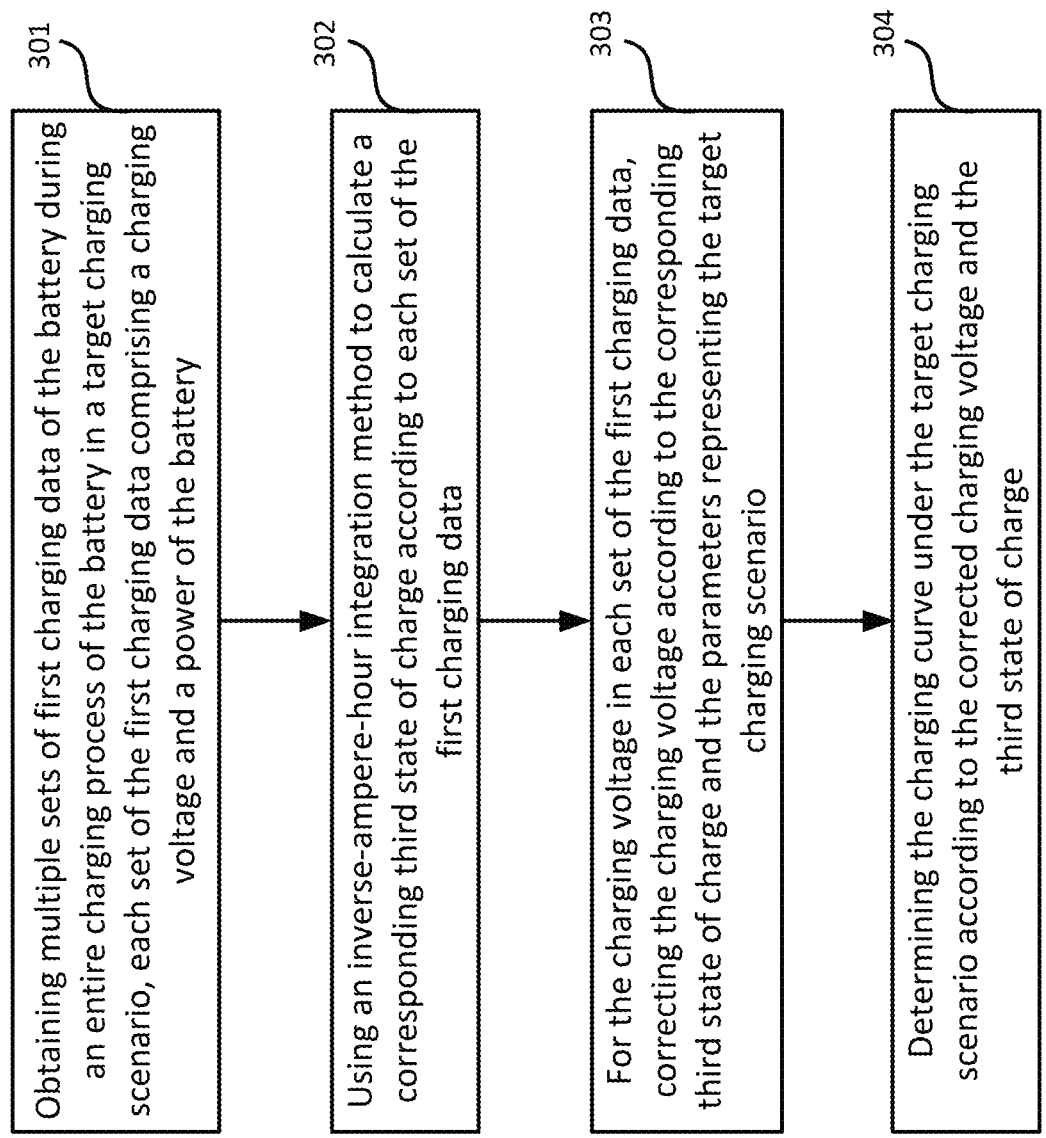
FIG. 3 shows schematically a flowchart a method for extracting a charging curve of a battery according to one embodiment of the invention.

FIG. 3 is a flowchart of a method for charging curve extraction according to one exemplary embodiment of the invention. The charging curve extracted according to the method can be used in the method for estimating the state of charge of the battery, disclosed above, to correct the state of charge. As the battery lifespan changes, the charging curve also change to a certain extent. When the SOC is calculated by the combination method, the higher the SOC, the higher the accuracy of the SOC calculation by the combination method. Accordingly, the charging curve in the high SOC area can be extracted by using the inverse-ampere-hour integration method. In the process of the charging curve extraction, the value of the SOC is calculated by using a combination method/algorithm, or similar algorithms, that is, in the later stage of charging, the higher the SOC, the higher the accuracy of SOC calculation. Referring to FIG. 3, the extraction method of the charging curve includes the following steps.

At step 301, obtaining multiple sets of charging data of the battery during the entire charging process of the battery in the target charging scenario, where each set of the charging data includes the charging voltage and the power (i.e., amount of electricity) of the battery.

The target charging scenario can be set according to the actual situation.

The multiple sets of the charging data may be the experimental data provided by the factory settings of the battery, or the data obtained according to the charging curve extracted previously.

The following is an implementation of the multiple sets of the charging data according to one embodiment of the invention.

For the ambient temperature being greater than 10° C., when the calculated SOC of the battery reaches 50%, the initial accumulative power Q is set to be 0, then the accumulation of the power Q is started, and the battery voltage value at this moment is recorded as V1, the present power is Q1, the present charging rate is I1, and the charging curve flag ChgSign is set to 1.

When the calculated SOC of the battery reaches an ordered SOC sequence of 55%, 60%, 65% . . . 100%, the corresponding battery voltage V, accumulated power Q and battery rate I are recorded.

When the SOC calculated by the combined algorithm or a similar algorithm exceeds 95%, and the battery charging voltage V exceeds 95% of the voltage corresponding to SOC=95% in ChgTable, the charging curve correction flag ChgSign is set to 2.

When ChgSign is set to 2, the charging is continued until the end of the charging, the end voltage $V_{end}$, the end rate $I_{end}$, the SOC $S_{end}$, and the end accumulated power $Q_{end}$ are recorded, where $V_{end}$<=the charging cut-off voltage.

Through sampling, the corresponding relationship of each parameter in the charging data is obtained in Table 3 as follows.

TABLE 3

Corresponding relationship of parameters

| SOC | 50 | 55 | 60 | 65 | 70 | 75 | 80 | 85 | 90 | 95 | 100 |
|---|---|---|---|---|---|---|---|---|---|---|---|
| Charging voltage | $V_1$ | $V_2$ | $V_3$ | $V_4$ | $V_5$ | $V_6$ | $V_7$ | $V_8$ | $V_9$ | $V_{10}$ | $V_{end}$ |
| Charging rate | $I_1$ | $I_2$ | $I_3$ | $I_4$ | $I_5$ | $I_6$ | $I_7$ | $I_8$ | $I_9$ | $I_{10}$ | $I_{end}$ |
| Power | $Q_1$ | $Q_2$ | $Q_3$ | $Q_4$ | $Q_5$ | $Q_6$ | $Q_7$ | $Q_8$ | $Q_9$ | $Q_{10}$ | $Q_{end}$ |

At step 302, using an inverse-ampere-hour integration method to calculate a corresponding third state of charge according to each set of the first charging data.

Since the SOC is calculated with the combination method, the higher the SOC, the higher the accuracy of the combination method in calculation of the SOC. If ChgSign is set to 2, it is considered that the accuracy of the estimated $S_{end}$ at the end of charging is very high. The formula for calculating the third charge by using the inverse-amplitude integral algorithm is as follows:

$$SOC_i = SOC_{end} - \frac{Q_{end} - Q_i}{Ca \cdot SOH};$$

where Ca represents the rated capacity (nominal capacity) of the battery.

Through the above formula, the corresponding relationship of each parameter in the charging data can be updated in accordance with Table 4.

TABLE 4

Updated corresponding relationship of parameters

| SOC | 50 | 55 | 60 | 65 | 70 | 75 | 80 | 85 | 90 | 95 | 100 |
|---|---|---|---|---|---|---|---|---|---|---|---|
| Charging voltage | $V_1$ | $V_2$ | $V_3$ | $V_4$ | $V_5$ | $V_6$ | $V_7$ | $V_8$ | $V_9$ | $V_{10}$ | $V_{end}$ |
| Charging rate | $I_1$ | $I_2$ | $I_3$ | $I_4$ | $I_5$ | $I_6$ | $I_7$ | $I_8$ | $I_9$ | $I_{10}$ | $I_{end}$ |
| Power | $Q_1$ | $Q_2$ | $Q_3$ | $Q_4$ | $Q_5$ | $Q_6$ | $Q_7$ | $Q_8$ | $Q_9$ | $Q_{10}$ | $Q_{end}$ |
| 3rd SOC | $SOC_1$ | $SOC_2$ | $SOC_3$ | $SOC_4$ | $SOC_5$ | $SOC_6$ | $SOC_7$ | $SOC_8$ | $SOC_9$ | $SOC_{10}$ | $SOC_{end}$ |

At step 303, for the charging voltage in each set of the first charging data, correcting the charging voltage according to the corresponding third state of charge and parameters representing the target charging scenario.

Taking the parameters of the charging rate representing the target charging scenario as an example, considering that the charging voltage corresponds to different charging rates and different internal resistances, looking up the internal resistance table RTable according to the third state of charge to obtain the internal resistance corresponding to the third state of charge, and then using the following formula to extract the charging curve of the specified rate, e.g., the charging curve of the specified rate can be the charging curve of 0 rate.

$$E_i = V_i - R\text{Table}(SOC_i) * I_i;$$

TABLE 5

Corresponding relationship of parameters

| SOC | 50 | 55 | 60 | 65 | ... | 90 | 95 | 100 |
|---|---|---|---|---|---|---|---|---|
| Charging voltage | $V_1$ | $V_2$ | $V_3$ | $V_4$ | ... | $V_9$ | $V_{10}$ | $V_{end}$ |
| Charging rate | $I_1$ | $I_2$ | $I_3$ | $I_4$ | ... | $I_9$ | $I_{10}$ | $I_{end}$ |
| Power | $Q_1$ | $Q_2$ | $Q_3$ | $Q_4$ | ... | $Q_9$ | $Q_{10}$ | $Q_{end}$ |
| 3rd SOC | $SOC_1$ | $SOC_2$ | $SOC_3$ | $SOC_4$ | ... | $SOC_9$ | $SOC_{10}$ | $SOC_{end}$ |
| Charging voltage at a specified rate | $E_1$ | $E_2$ | $E_3$ | $E_4$ | ... | $E_9$ | $E_{10}$ | $E_{end}$ |

Considering that when charging to the cut-off voltage, the SOC corresponds to 100%, so Table 5 above is updated as Table 6 below:

TABLE 6

Updated corresponding relationship of parameters

| 3rd SOC | $SOC_1$ | $SOC_2$ | $SOC_3$ | $SOC_4$ | ... | $SOC_{10}$ | $SOC_{end}$ | 100% |
|---|---|---|---|---|---|---|---|---|
| Charging voltage at a specified rate | $E_1$ | $E_2$ | $E_3$ | $E_4$ | ... | $E_{10}$ | $E_{end}$ | Cut-off voltage |

In one embodiment, the above method is also utilized to obtain the charging curve of the low SOC.

In one embodiment, for the low SOC charging curve, the charging voltage ChgV corresponding to $SOC_1$ is obtained by looking up the original 0-rate charging table ChgTable according to $SOC_1$, and the voltage difference between ChgV and $E_1$ is calculated errV=$E_1$−ChgV.

For the value of the SOC less than $SOC_1$ in ChgTable, adding errV, and combining with the above Table 6 to get a new Table 7 of the charging curve.

Based on Table 7 of the new charging curve, finding the charging voltage corresponding to SOC=0%, 5% ... 95%, 100%. This series of voltage values is the charging curve in the target charging scenario, and updating it to ChgTable.

At step 305, determining the charging curve under the target charging scenario according to the corrected charging voltage and the third state of charge.

The charging curve obtained in step 305 is used to correct the state of charge in the method for estimating the state of charge of the battery disclosed in any of the above embodiments.

Figure 4:
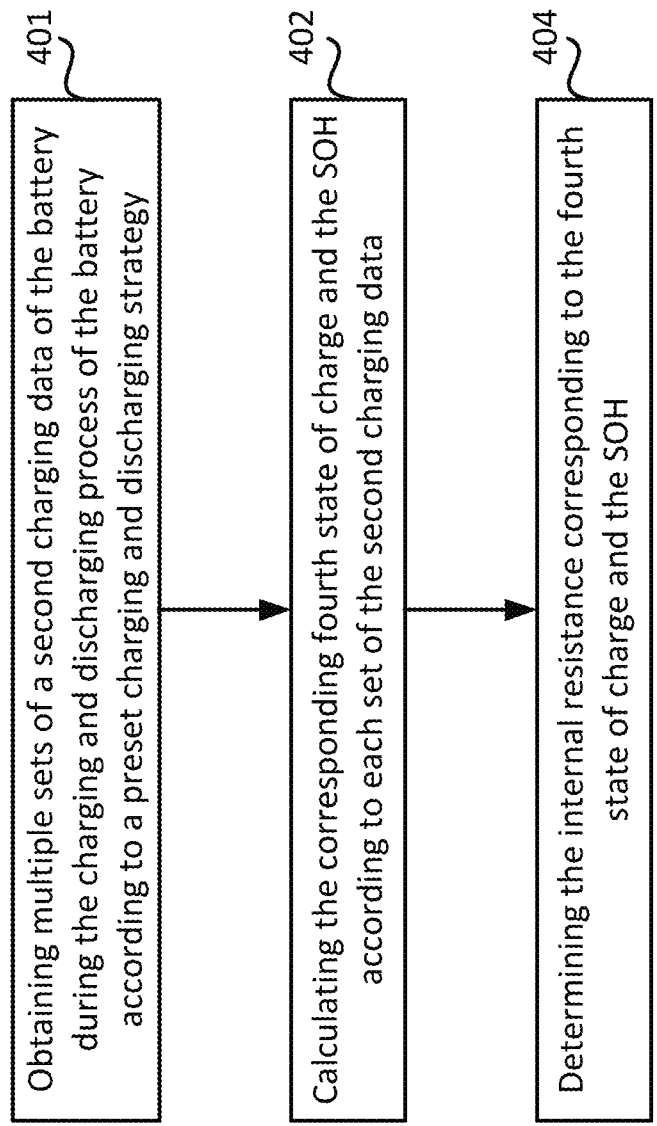
FIG. 4 shows schematically a flowchart of a method for extract a SOH and internal resistance according to one embodiment of the invention.

FIG. 4 is a flow chart of a method for extracting the state of health (SOH) and internal resistance according to one exemplary embodiment of the invention. The SOH and internal resistance extracted based on this method can be used for state of charge estimation and charging curve extraction in any of the above-disclosed embodiments. Referring to FIG. 4, the method includes the following steps.

At step 401, obtaining multiple sets of a second charging data of the battery during the charging and discharging process of the battery according to a preset charging and discharging strategy. Each set of the second charging data includes the charging voltage of the battery, the power, and the resting voltage of the battery after resting.

Accurate extraction of the charging curves and accurate correction of the SOC depend on the accuracy of the SOH and the internal resistance, however, it is difficult for online algorithms to obtain accurate SOH and internal resistance values under different SOCs. With the development of automobiles or energy storage, the equipment is used regularly to test the battery module or battery pack according to the preset charging and discharging strategy. During the testing process, the corresponding charging and discharging conditions can be set to detect the internal resistance and the SOH.

In one embodiment, the preset charge and discharge strategy is as follows:

Step S1, at room temperature, using the battery testing equipment to adopt the working condition of 0.3C charging rate, and discharging the battery to the cut-off voltage;

Step S2, standing still for 30 minutes, setting the power to 0;

Step S3, using the 0.3C charging rate, accumulating the power Q;

Step S4, when the variation of the power is >=5% of the nominal capacity, recording the voltage $V_i$ at the time (i=1, 2, 3 ... m, m<20);

Step S5, quickly reducing the charging rate to 0, and standing static for 3-5 minutes, recording the voltage $U_i$ after standing (i=1, 2, 3 ... m, m<20), and recording the value of the power Q at the same time, i.e., $Q_i$;

Step S6, repeat steps S3-S5 until the battery is fully charged to the cut-off voltage, recording the cut-off charging power as $Q_{end}$.

TABLE 7

| New charging curve | | | | | | | | |
|---|---|---|---|---|---|---|---|---|
| 2nd SOC | 0 | 5 | ... | $SOC_4$ | ... | $SOC_{10}$ | $SOC_{end}$ | 100% |
| Charging voltage at a specified rate | ChgTable[1]-errV | ChgTable[2]-errV | ... | $E_4$ | ... | $E_{10}$ | $E_{end}$ | Cut-off voltage |

Sat step 402, calculating the corresponding fourth state of charge and the SOH according to each set of the second charging data.

In one embodiment, the calculation formula of the SOH is expressed as follows:

$$SOH = Q_{end}/Ca \cdot 100\%;$$

Accordingly, a series of corresponding voltage values before and after standing under different charging capacities can be obtained, as shown in Table 8 below.

TABLE 8

Corresponding voltage values before and after standing

| Power | $Q_1$ | $Q_2$ | $Q_3$ | $Q_4$ | ... | $Q_{m-1}$ | $Q_m$ | $Q_{end}$ |
|---|---|---|---|---|---|---|---|---|
| Charging voltage | $V_1$ | $V_2$ | $V_3$ | $V_4$ | ... | $V_{m-1}$ | $V_m$ | |
| Standing voltage | $U_1$ | $U_2$ | $U_3$ | $U_4$ | ... | $U_9$ | $U_{10}$ | |

Using the power to calculate the fourth state of charge under any power as follows:

$$S\_i = \frac{Q_i}{Q_{end}} \cdot 100\%;$$

where S_i represents the fourth state of charge.

Then, obtaining the fourth state of charge corresponding to different charge capacities, which are shown in Table 9.

TABLE 9

Fourth state of charge corresponding to different charge capacities

| Power | $Q_1$ | $Q_2$ | $Q_3$ | $Q_4$ | ... | $Q_{m-1}$ | $Q_m$ | $Q_{end}$ |
|---|---|---|---|---|---|---|---|---|
| Charging voltage | $V_1$ | $V_2$ | $V_3$ | $V_4$ | ... | $V_{m-1}$ | $V_m$ | |
| Standing voltage | $U_1$ | $U_2$ | $U_3$ | $U_4$ | ... | $U_9$ | $U_{10}$ | |
| 4th SOC | S_1 | S_2 | S_3 | S_4 | | S_{m-1} | S_{m} | |

At step 403, determining the internal resistance corresponding to the fourth state of charge and the SOH.

Using the recorded charging voltage V and standing voltage U to calculate the internal resistance R, as follows:

$$R\_i = \frac{V_i - U_i}{I_c} \cdot 100\%;$$

Then, obtaining the corresponding internal resistance value under different charge capacities, as shown in Table 10 below.

TABLE 10

Corresponding internal resistance value under different charge capacities

| Power | $Q_1$ | $Q_2$ | $Q_3$ | $Q_4$ | ... | $Q_{m-1}$ | $Q_m$ | $Q_{end}$ |
|---|---|---|---|---|---|---|---|---|
| Charging voltage | $V_1$ | $V_2$ | $V_3$ | $V_4$ | ... | $V_{m-1}$ | $V_m$ | |
| Standing voltage | $U_1$ | $U_2$ | $U_3$ | $U_4$ | ... | $U_9$ | $U_{10}$ | |
| 4th SOC | S_1 | S_2 | S_3 | S_4 | ... | S_{m-1} | S_{m} | 100% |
| Internal resistance | R_1 | R_2 | R_3 | R_4 | ... | R_{m-1} | R_{m} | |

Based on Table 10, the internal resistance of the SOC of 0% and 100% cannot bet obtained. In the process of extracting the charging curve, the internal resistance of the low SOC is not important, so the internal resistance can be R_1 when the SOC is 0%. In addition, the cut-off voltage is the same, so the corresponding internal resistance for the SOC being 100% is 0. Accordingly, all internal resistance values of the SOC in the range of 0-100% can be obtained as shown in Table 11 below:

TABLE 11

Internal resistance values of the SOC in the range of 0-100%

| 4th SOC | 0% | S_2 | S_3 | S_4 | ... | S_{m-1} | S_{m} | 100% |
|---|---|---|---|---|---|---|---|---|
| Internal resistance | R_1 | R_2 | R_3 | R_4 | ... | R_{m-1} | R_{m} | 0 |

Based on Table 11, looking up the table to obtain the internal resistance corresponding to the SOC interval of 5%, to obtain a new internal resistance table. Updating the SOH and the internal resistance table obtained by the above method to the SOH and the internal resistance table RTable in the combination algorithm.

Based on the combination algorithm, the charging curve is calculated with the inverse-ampere-hour integral method, which is simple in calculation, high in robustness, and strong in interpretability. The method is not affected by battery aging, and the charging curve can be accurately extracted during the entire life cycle. The simple working conditions of the battery can be designed by inspection equipment, so as to effectively identify the parameters of the battery. The cooperation of the three measures can ensure that the SOC accuracy is effective within the entire life cycle.

The reliability of one embodiment of the invention is illustrated below by comparing with the experimental data of the related technology.

Figure 5A:
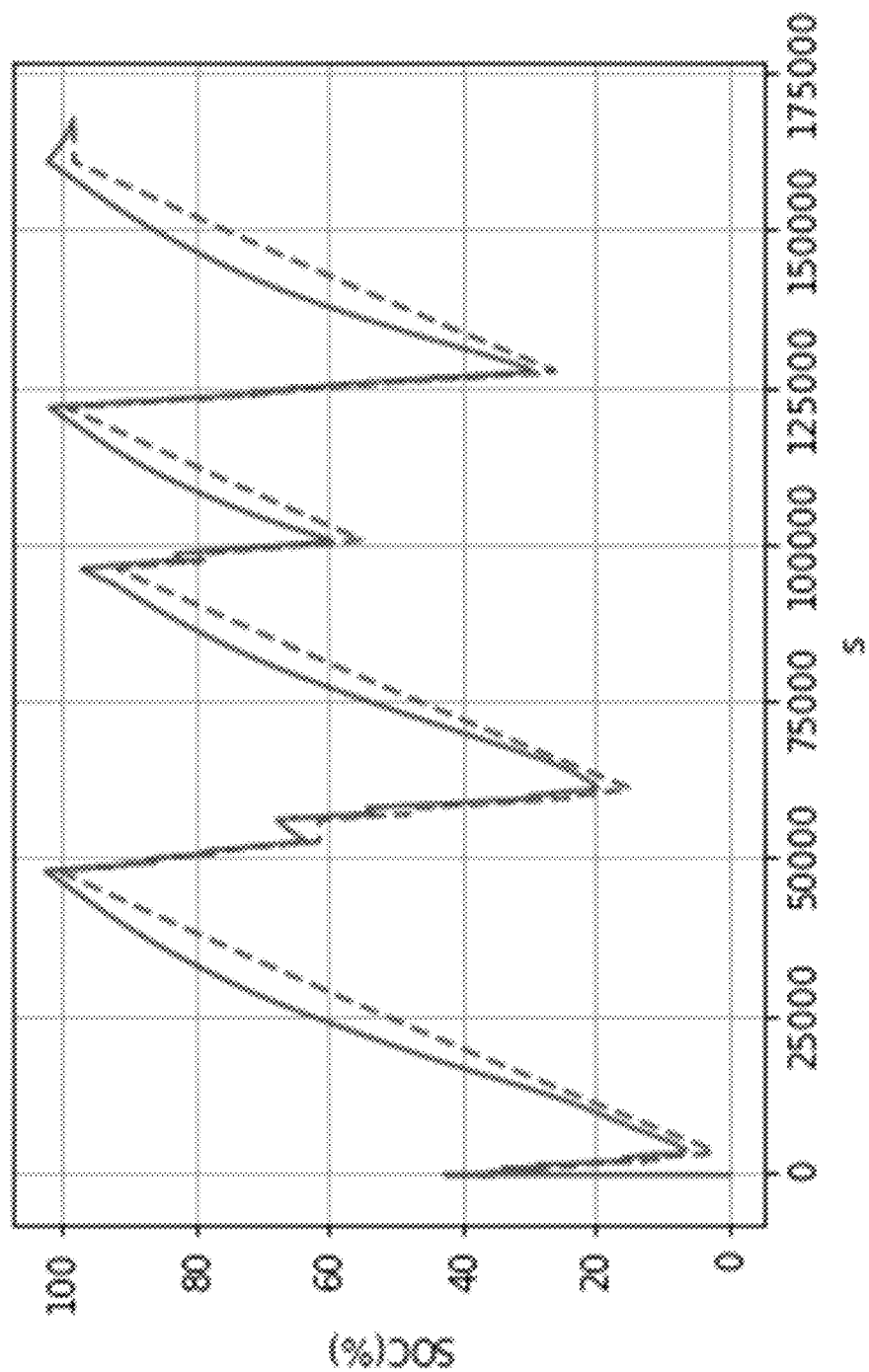
FIG. 5A shows the SOC obtained by Kalman filter and the real SOC according to one embodiment of the invention.

During the driving process of a real vehicle, the charging curve can be re-extracted through the method according to one embodiment of the invention, so that the improvement to the accuracy of the SOC estimation can be achieved. The data source of this experiment is 168225 time data of a single lithium battery during the driving process of the real vehicle, including voltage, current, temperature and other parameters. The built-in SOC calculation method of the battery is the Kalman filter based on the ampere-hour integral. Before the charging curve is extracted, the SOC obtained by the Kalman filter and the real SOC (the experimentally measured SOC) are shown in FIG. 5A, where the abscissa is the time (unit is s), the ordinate is the SOC (0-100%), the dotted line in the figure is the real SOC, and the solid line is the estimated SOC obtained by the Kalman filter based on the ampere-hour integral.

Figure 5B:
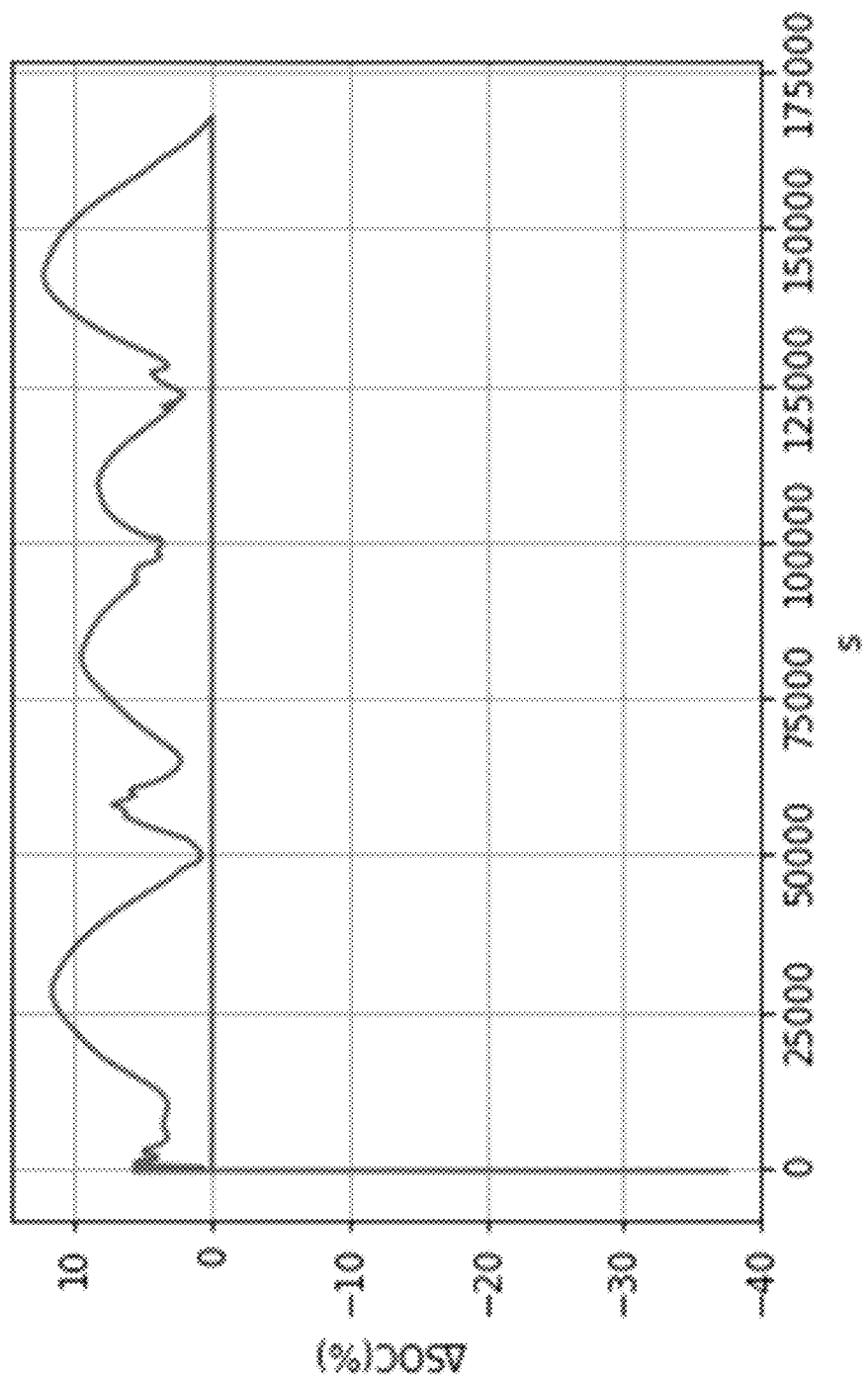
FIG. 5B shows the error between the real SOC and the estimated SOC according to one embodiment of the invention.

FIG. 5B shows the error between the real SOC and the estimated SOC. It can be seen that the maximum error is higher than 10%, which is greater than the industry SOC error standard of 5%. It is because the SOC-OCV curve used in the Kalman filtering equation is not accurate, and/or the initial SOC-OCV calibration is not accurate, and/or the SOC-OCV curve is changed after the battery ages.

Figure 5C:
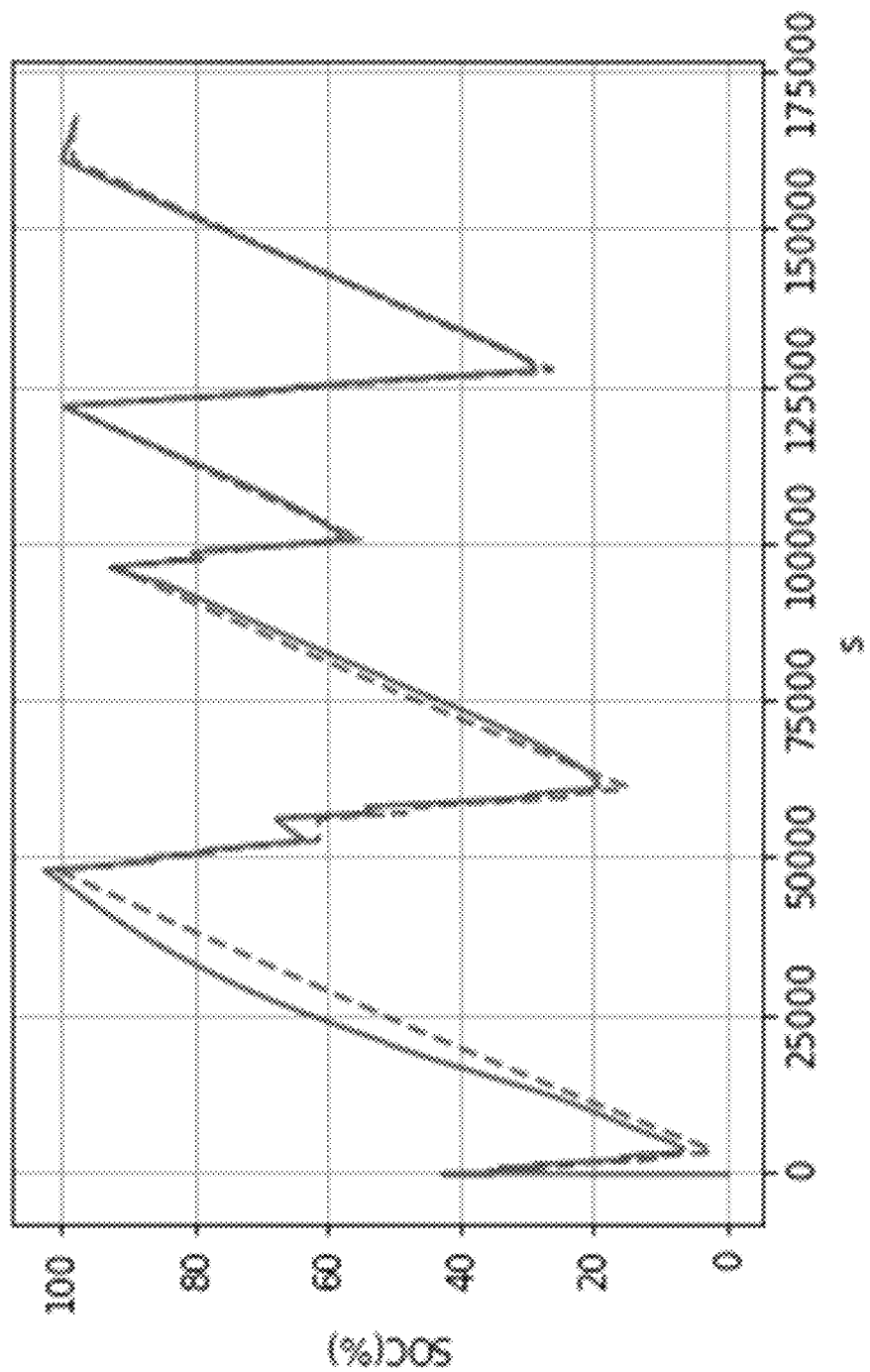
FIG. 5C is the SOC obtained by the method and the real SOC according to one embodiment of the invention.
Figure 5D:
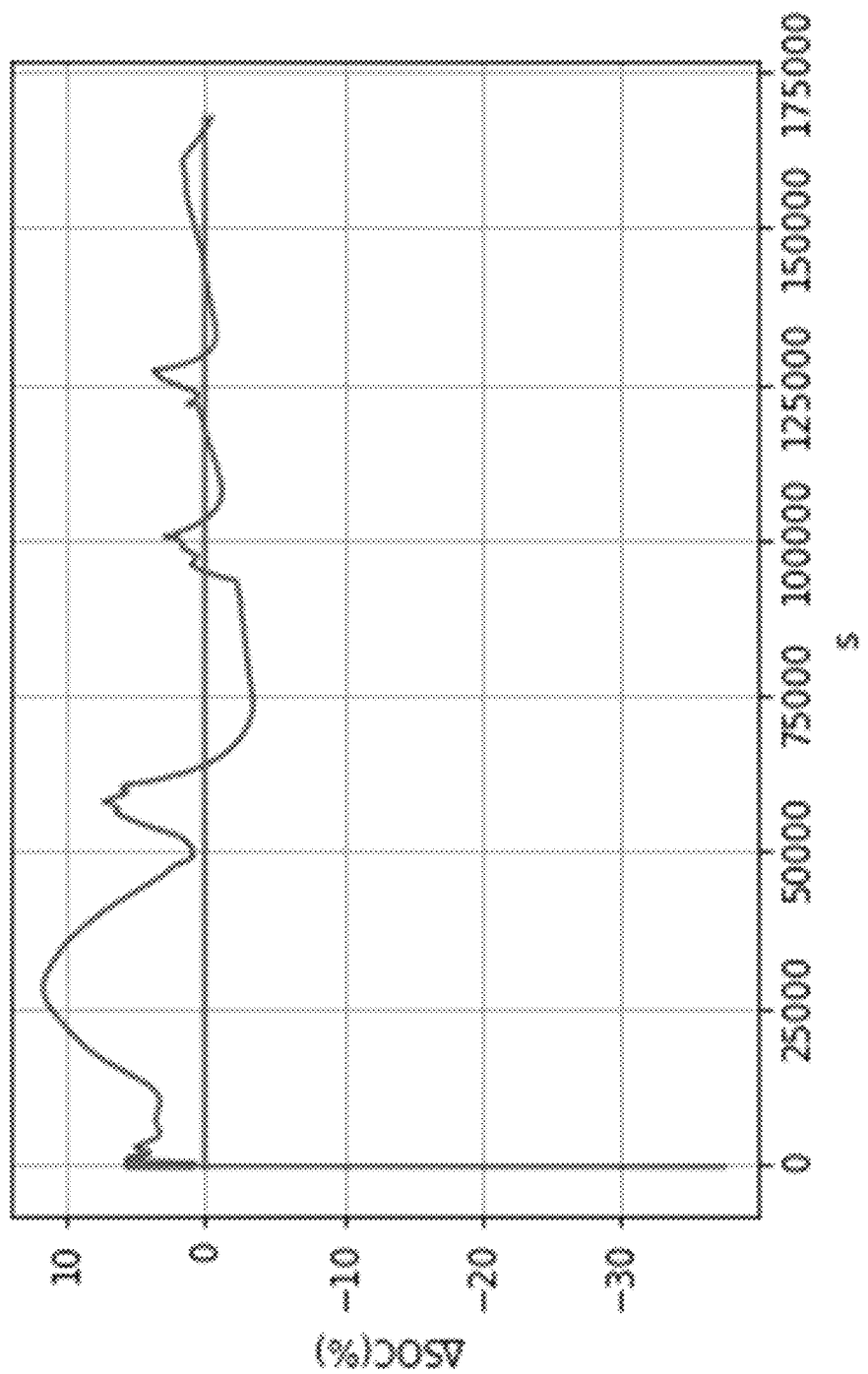
FIG. 5D is the error between the real SOC and the estimated SOC according to one embodiment of the invention.

Using one embodiment of the method according to the invention to re-extract the charging curve, after the first round of charging reaches the cut-off voltage, the SOC calibration during the charging process is performed by the reverse ampere-hour integration method, and the new SOC-OCV corresponding to the charging process can be obtained. According to the newly calibrated SOC-OCV curve, the Kalman filtering is performed on the subsequent charging process. The SOC obtained by the Kalman filtering and the real SOC are shown in FIG. 5C. FIG. 5D shows the error between the real SOC and the estimated SOC. Clearly, after the first round of charging, after the SOC-OCV is recalibrated by reverse integration, the SOC obtained by the second round of Kalman filtering can converge to an error of about 5%, which indicates a good correction effect is achieved.

The following discloses a usage scenario, a battery sorting scheme for cascaded batteries or retired batteries, according to one embodiment of the invention.

According to the battery performance attenuation and state characteristics of the electric vehicle industry, a battery needs to be replaced when the battery capacity drops to 80% of the rated capacity. At this time, although the retired batteries cannot continue to be used in the electric vehicle, they may still have a space for utilization. If the retired lithium batteries can be used reasonably, the cost of battery usage can be greatly reduced.

To solve the problem of battery cascade utilization, it is necessary to sort out the retired batteries with better consistency. In one embodiment of the invention, the battery SOH, the internal resistance, and the SOC-OCV curve are recalibrated, which has great practical significance for the re-use of cascaded/retired batteries.

By judging the SOH of the battery, the battery with excessive capacity decay is eliminated, and then the new SOC-OCV curve is calibrated by the reverse ampere-hour integration method, and the consistency of the SOC-OCV curve of a batch of batteries is judged, and the outliers with large gaps are discarded. Finally, the internal resistance value is used to group them. Those with the larger remaining capacity and small internal resistance are classified into a first group, those with the large remaining capacity and large internal resistance are classified into a second group, and those with the small remaining capacity and large internal resistance are classified into a third group, and those with small remaining capacity and small internal resistance are classified into a fourth group. After the grouping is reassembled, a new batch of cascaded/retired batteries with better consistency can be obtained.

In certain aspects, the invention also provides a device for performing the foregoing methods for estimating the state of charge of a battery according to the embodiments of the invention.

The device includes an estimation module, a determining module, and a correction module.

The estimation module is configured to estimate the first state of charge of the battery.

The determining module is configured to determine a charging curve conforming to the present charging scenario; wherein the present charging scenario is characterized by at least one of the following parameters: the ambient temperature of the battery, the charging rate, the internal resistance of the battery, and the state of health of the battery, the battery lifespan, and the battery open circuit voltage.

The correction module is configured to correct the first state of charge according to the charging curve to obtain the final state of charge of the battery.

In one embodiment, the correction module includes a determining unit and a correction unit.

The determining unit is configured to determine a present charging voltage of the battery, determine a second state of charge corresponding to the present charging voltage according to the charging curve, and determine an amount of the state of charge correction according to the second state of charge.

The correction unit is configured to correct the first state of charge according to the correction amount of the state of charge to obtain the final state of charge of the battery.

Optionally, when determining the amount of the state of charge correction according to the second state of charge, the determining unit is configured to determining a correction weight corresponding to the second state of charge; the correction weight is positively correlated with the second state of charge.

In one embodiment, a product result of a state of charge difference and a correction weight is determined as the amount of the state of charge correction, and the state of charge difference is a difference between the second state of charge and the first state of charge.

Optionally, the device may also include a judging module, configured to judge whether the charging voltage of the battery is greater than the voltage threshold.

If the judgment result is yes, the determining module is called to determine the charging curve conforming to the present charging scenario.

In one embodiment, the first state of charge of the battery is estimated based on the ampere-hour integration method.

In another embodiment, the first state of charge of the battery is estimated based on a Kalman filter method.

In certain aspects, the invention provides a device for charging curve extraction, including an acquisition module, calculation module, a correction module, a determining module.

The acquisition module is configured to acquire multiple sets of first charging data of the battery during the entire charging process of the battery in the target charging scenario, wherein each set of first charging data includes the charging voltage and power of the battery; the target charging scenario is represented by at least one of the following parameters: the ambient temperature of the battery, the charging rate, the internal resistance of the rate, the state of battery health, battery lifespan, and the open circuit voltage.

The calculation module is used to calculate the corresponding third state of charge according to each set of first charging data by using the inverse-ampere integral algorithm;

The correction module is configured to, for each set of charging voltages in the first charging data, modify the charging voltage according to the corresponding third state of charge and the parameters representing the target charging scenario.

The determining module is configured to determine the charging curve under the target charging scenario according to the corrected charging voltage and the third state of charge.

Optionally, the third state of charge is calculated by the following formula:

$$SOC_i = SOC_{end} - \frac{Q_{end} - Q_i}{Ca \cdot SOH};$$

where SOC represents the third state of charge of the i-th group of the first charging data; $SOC_{end}$ represents the state of charge of the battery at the end of charging; Ca represents the rated capacity of the battery; and SOH represents the state of health of the battery.

In one embodiment, the device also includes a SOH acquisition module configured to obtain multiple sets of the second charging data of the battery during the charging and discharging process of the battery according to the preset charging and discharging strategy.

In one embodiment, the corresponding SOH is calculated according to each set of the second charging data.

As for the device embodiments, since they basically correspond to the method embodiments, for the related parts, please refer to the parts of the description of the method embodiments. The device embodiments described above are only illustrative, and the modules/units described as separate components may or may not be physically separated, and the components shown as modules/units may or may not be physical units, can be located in one place, or can also be distributed to multiple network elements. Part or all of the modules can be selected according to actual needs to achieve the purpose of the solution of the invention. Moreover, these modules can be implemented in the form of calling software through processing elements, or can be implemented in the form of hardware, or some modules can be implemented in the form of calling software through processing elements, and some modules can be implemented in the form of hardware. For example, the x module can be a separate processing element, and can also be integrated in a chip of the above-disclosed system/apparatus. In addition, the x module can also be stored in the memory of the above-disclosed system/apparatus in the form of program codes, and can be invoked by certain processing elements of the above-disclosed system/apparatus to execute the functions of the x module. The implementation of other modules is similar. All or part of these modules can be integrated together, and can also be implemented independently. The processing elements mentioned here may be an integrated circuit with signal processing capability. In the implementation process, each step of the above disclosed method or each module above can be completed by an integrated logic circuit of hardware in the processor element or an instruction in the form of software. The above modules may be one or more integrated circuits configured to implement the above method, for example: one or more application specific integrated circuit (ASIC), one or more microprocessors (e.g., digital signal processor, DSP), one or more field programmable gate array (FPGA), etc. When one of the above modules is implemented in the form of a processing element scheduling program codes, the processing element may be a general-purpose processor, such as a central processing unit (CPU) or other processors that can call program codes. These modules can be integrated together and realized in the form of System-on-a-chip (SOC). It can be understood and implemented by those skilled in the art without creative effort.

Figure 6:
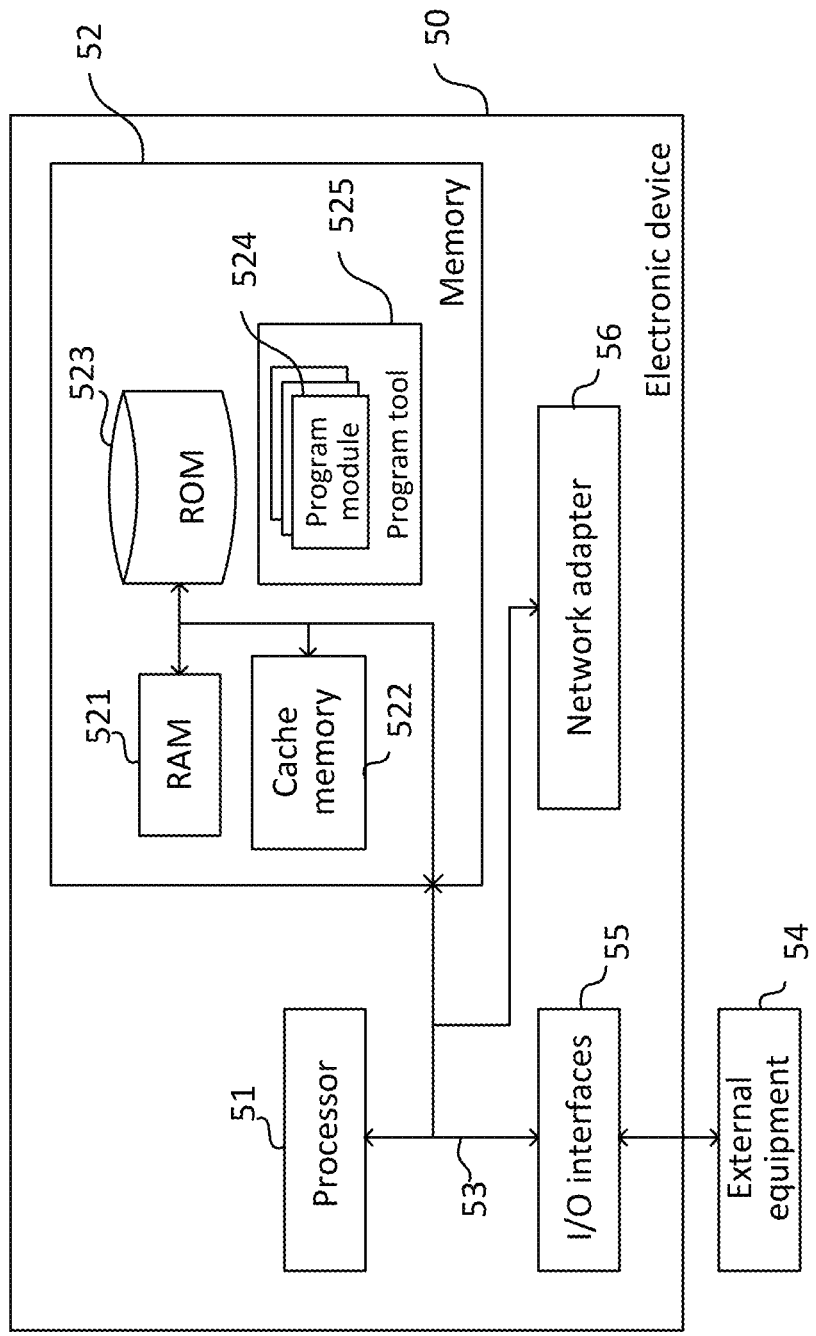
FIG. 6 is a schematic structural diagram of an electronic device according to one embodiment of the invention.

FIG. 6 is a schematic structural diagram of an electronic device according to an exemplary embodiment of the invention. The electronic device 50 shown in FIG. 6 is only an example, and should not limit the functions and scope of use of the embodiments of the invention.

As shown in FIG. 6, the electronic device 50 may be in the form of a general-purpose computing device, for example, it may be a server device. Components of the electronic device 50 may include, but are not limited to: at least one processor 51, at least one memory 52, and a bus 53 connecting different system components including the memory 52 and the processor 51.

The bus 53 includes a data bus, an address bus and a control bus.

The memory 52 may include a volatile memory, such as a random access memory (RAM) 521 and/or a cache memory 522, and may further include a read only memory (ROM) 523.

The memory 52 may also include a program tool 525 (or utility) having a set (at least one) of program modules 524, such program modules 524 including, but not limited to: an operating system, one or more application programs, other program modules, and program data, each or some combination of these examples may include the implementation of the network environment.

The processor 51 operably executes various functional applications and data processing by running the computer program stored in the memory 52, such as the method provided by any of the above-disclosed embodiments.

Electronic device 50 may also communicate with one or more external devices 54 (e.g., keyboards, pointing devices, etc.). Such communication may occur through input/output (I/O) interface 55. Also, the model-generating electronic device 50 can also communicate with one or more networks (e.g., a local area network (LAN), a wide area network (WAN) and/or a public network, such as the Internet) via a network adapter 56. As shown, network adapter 56 communicates with other modules of model generation electronics 50 via bus 53. It should be understood that although not shown in the figures, other hardware and/or software modules may be used in conjunction with the model generation electronics 50, including, but not limited to: microcode, device drivers, redundant processors, external disk drive arrays, RAID (disk array) systems, tape drives, and data backup storage systems.

It should be noted that although several units/modules or subunits/modules of an electronic device are disclosed in the above detailed description, such division is only exemplary and not mandatory. Actually, according to one embodiment, the features and functions of two or more units/modules described above may be embodied in one unit/module. Conversely, the features and functions of one unit/module described above can be further divided to be embodied by a plurality of units/modules.

One aspect of the invention also provides a computer-readable storage medium, on which a computer program is stored, and when the program is executed by a processor, the method provided in any of the foregoing embodiments is implemented.

In one embodiment, the computer-readable storage medium may more specifically include, but not limited to: portable disk, hard disk, random access memory, read-only memory, erasable programmable read-only memory, optical storage device, magnetic storage device or any of the above-mentioned the right combination.

One embodiment of the invention can also be implemented in the form of a program product, which includes program codes. When the program product runs on a terminal device, the program codes are used to make the terminal device execute the method for implementing any one of the foregoing embodiments.

In one embodiment, the program code for executing the invention can be written in any combination of one or more programming languages, and the program code can be completely executed on the user equipment, partially executed on the user equipment, or used as an independent The software package executes, partly on the user device and partly on the remote device, or entirely on the remote device.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the invention pertains without departing from its spirit and scope. Accordingly, the scope of the invention is defined by the appended claims rather than the foregoing description and the exemplary embodiments described therein.

What is claimed is:

1. A method for estimating a state of charge of a battery, comprising:
   estimating a first state of charge of the battery;
   determining a charging curve that conforms to a present charging scenario, wherein the present charging scenario is characterized by at least one of parameters including an ambient temperature, a charging rate, an internal resistance, a state of health, a lifespan, and an open circuit voltage of the battery; and
   correcting the first state of charge according to the charging curve to obtain a final state of charge of the battery, wherein said correcting the first state of charge according to the charging curve comprises:
   determining a present charging voltage of the battery;
   determining a second state of charge corresponding to the present charging voltage according to the charging curve;
   determining an amount of a state of charge correction according to the second state of charge; and
   correcting the first state of charge according to the amount of the state of charge correction to obtain the final state of charge of the battery.

2. The method according to claim 1, wherein said determining the amount of the state of charge correction according to the second state of charge comprises:
   determining a correction weight corresponding to the second state of charge, wherein the correction weight is positively correlated with the second state of charge; and
   determining a product result of a state of charge difference and a correction weight as the amount of the state of charge correction, wherein the state of charge difference is a difference between the second state of charge and the first state of charge.

3. The method according to claim 1, further comprising, before determining the charging curve that confirms to the present charging scenario:
   judging whether the charging voltage of the battery is greater than a voltage threshold; and
   when the judgment result is yes, determining the charging curve conforming to the present charging scenario.

4. The method according to claim 1, wherein said estimating a first state of charge of the battery comprises:
   estimating the first state of charge of the battery based on a ampere-hour integration method; or
   estimating the first state of charge of the battery based on a Kalman filter method.

5. A method for extracting a charging curve of a battery, comprising:
   obtaining multiple sets of first charging data of the battery during an entire charging process of the battery in a target charging scenario, wherein each set of the first charging data comprises a charging voltage and a power of the battery, and the target charging scenario is characterized by at least one of parameters including an ambient temperature, a charging rate, an internal resistance, a state of health, a lifespan, and an open circuit voltage of the battery;
   using an inverse-ampere-hour integration method to calculate a corresponding third state of charge according to each set of the first charging data;
   for the charging voltage in each set of the first charging data, correcting the charging voltage according to the corresponding third state of charge and the parameters representing the target charging scenario; and
   determining the charging curve under the target charging scenario according to the corrected charging voltage and the third state of charge.

6. The method according to claim 5, wherein the third state of charge is calculated by a formula of:

$$SOC_i = SOC_{end} - \frac{Q_{end} - Q_i}{Ca \cdot SOH};$$

wherein $SOC_i$ represents the third state of charge of the i-th set of the first charging data; $SOC_{end}$ represents the state of charge of the battery at the end of charging; Ca represents a rated capacity of the battery; and SOH represents the state of health of the battery.

7. The method according to claim 6, wherein the SOH is obtained by
   obtaining multiple sets of a second charging data of the battery during the charging and discharging process of the battery according to a preset charging and discharging strategy; and
   calculating the corresponding SOH according to each set of the second charging data.

8. A device for estimating a state of charge of a battery, comprising:
   an estimation module configured to estimate a first state of charge of the battery;
   a determining module configured to determine a charging curve conforming to a present charging scenario; wherein the present charging scenario is characterized by at least one of parameters including an ambient temperature, a charging rate, an internal resistance, a state of health, a lifespan, and an open circuit voltage of the battery; and
   a correction module configured to correct the first state of charge according to the charging curve to obtain a final state of charge of the battery, by
   determining a present charging voltage of the battery;
   determining a second state of charge corresponding to the present charging voltage according to the charging curve;
   determining an amount of a state of charge correction according to the second state of charge; and
   correcting the first state of charge according to the amount of the state of charge correction to obtain the final state of charge of the battery.

9. A device for extracting a charging curve of a battery, comprising:
   an acquisition module configured to obtain multiple sets of first charging data of the battery during an entire charging process of the battery in a target charging scenario, wherein each set of the first charging data comprises a charging voltage and a power of the battery, and the target charging scenario is characterized by at least one of parameters including an ambient temperature, a charging rate, an internal resistance, a state of health, a lifespan, and an open circuit voltage of the battery;

a calculation module configured to calculate a corresponding third state of charge according to each set of the first charging data by using an inverse-ampere integration method;

a correction module configured to, for each set of charging voltages in the first charging data, correct the charging voltage according to the corresponding third state of charge and the parameters representing the target charging scenario; and a determining module configured to determine the charging curve under the target charging scenario according to the corrected charging voltage and the third state of charge.

10. An electronic device, comprising:

at least one memory, at least one processor, and a computer program stored on the at least memory and operable on the processor, wherein, when the processor executes the computer program, the method of claim 1 is implemented.

11. An electronic device, comprising:

at least one memory, at least one processor, and a computer program stored on the at least memory and operable on the processor, wherein, when the processor executes the computer program, the method according to claim 5 is implemented.

12. A non-transitory tangible computer-readable storage medium, on which a computer program is stored, wherein, when the computer program is executed by a processor, the method according to claim 1 is implemented.

13. A non-transitory tangible computer-readable storage medium, on which a computer program is stored, wherein, when the computer program is executed by a processor, the method according to claim 5 is implemented.

* * * * *